(12) United States Patent
Jany et al.

(10) Patent No.: US 10,727,849 B2
(45) Date of Patent: Jul. 28, 2020

(54) FREQUENCY SYNTHESIS DEVICE WITH HIGH MULTIPLICATION RANK

(71) Applicant: COMMISSARIAT A L'ENERGIE ATOMIQUE ET AUX ENERGIES ALTERNATIVES, Paris (FR)

(72) Inventors: Clement Jany, Grenoble (FR);
Frederic Hameau, Grenoble (FR);
Alexandre Siligaris, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/573,082

(22) Filed: Sep. 17, 2019

(65) Prior Publication Data

US 2020/0091921 A1 Mar. 19, 2020

(30) Foreign Application Priority Data

Sep. 19, 2018 (FR) .................................... 18 58472

(51) Int. Cl.
*H03L 7/20* (2006.01)
*H03L 7/099* (2006.01)
*H03K 3/03* (2006.01)
*H03L 7/093* (2006.01)

(52) U.S. Cl.
CPC ............ *H03L 7/20* (2013.01); *H03K 3/03* (2013.01); *H03L 7/093* (2013.01); *H03L 7/099* (2013.01)

(58) Field of Classification Search
CPC ....................................................... H03L 7/20

USPC ........................................................ 331/55
See application file for complete search history.

(56) References Cited

U.S. PATENT DOCUMENTS 5,818,305 A * 10/1998 Jeon .......................... H03L 7/07
331/47
5,982,242 A * 11/1999 Jun ........................... H03L 7/24
331/49

FOREIGN PATENT DOCUMENTS

FR 2 983 370 A1 5/2013
FR 3 006 131 A1 11/2014

OTHER PUBLICATIONS

U.S. Appl. No. 16/531,877, filed Aug. 5, 2019, Alexandre Siligaris.
U.S. Appl. No. 16/570,549, filed Sep. 13, 2019, Clement Jany.
U.S. Appl. No. 16/227,913, filed Dec. 20, 2018, US 2019-0199399 A1, Tien-Tu Vo.

(Continued)

*Primary Examiner* — Joseph Chang
(74) *Attorney, Agent, or Firm* — Oblon, McClelland, Maier & Neustadt, L.L.P.

(57) ABSTRACT

A frequency synthesis device with high multiplication rank, including a base frequency generator generating two first base signals of square shape of same frequency and opposite to each other, a first synthesis stage including two first switching power supply oscillators, of which the power supplies are respectively switched by the two first base signals, a second synthesis stage including a second switching power supply oscillator of which the supply is switched by a combination of the output signals of the two first oscillators, the output of the second switching power supply oscillator being filtered by a frequency discriminator circuit realized with an injection locked oscillator.

7 Claims, 8 Drawing Sheets

(56) References Cited

OTHER PUBLICATIONS

French Preliminary Search Report dated Jul. 15, 2019 in Patent Application No. 1858472, 2 pages (with English translation of categories of cited references).
Jany, C. et al. "A Programmable Frequency Multiplier-by-29 Architecture for Millimeter Wave Applications" IEEE Journal of Solid-State Circuits, vol. 50, No. 7, XP011585481, 2015, pp. 1669-1679.
Tiebout, M. "A 50GHz direct inject locked oscillator topology as low power frequency divider in 0.13 μm CMOS" Proc. of the 29th European Solid State Circuits Conference, 2003, pp. 73-76.

* cited by examiner

FREQUENCY SYNTHESIS DEVICE WITH HIGH MULTIPLICATION RANK

TECHNICAL FIELD

The present invention generally applies to the field of high frequency synthesis devices with low phase noise and low consumption. It notably finds application in the next generations of telecommunication systems using the unlicensed band around 60 GHz.

PRIOR ART

The next telecommunication systems will use the millimetric frequency range and will have for most of them to be capable of accessing in an opportunistic manner the unlicensed band around 60 GHz. However, the rollout of these systems assumes that it is possible to produce oscillators with low phase noise and low consumption in this frequency range.

A candidate suited for this purpose is the frequency synthesis device with low phase noise and low consumption described in the application FR-A-2 983 370 filed in the name of the present applicant.

This device, 100, has been represented schematically in FIG. 1. It includes a generator of a base frequency $f_1$, 110, stable in frequency and in phase. This generator may for example use a reference signal of low periodic frequency stable in frequency and in phase supplied by a quartz resonator, 105, as indicated in the figure. In this case, the generator 110 includes a VCO type oscillator and a phase locking loop (PLL) servo-controlling the frequency $f_1$ of the VCO oscillator at a sub-multiple of the frequency of the resonator, $f_{quartz}$. Alternatively, the base frequency generator may be simply the signal from a quartz resonator temperature stabilised at the frequency $f_1$.

The base signal, $s_1$, supplied by the generator 110, is a square signal (of which the duty cycle is not necessarily equal to ½). It serves to switch the power supply source (in current or in voltage) of a VCO type oscillator 130 of which the frequency is controlled by a control voltage $V_{ctrl}$. The periodic interruption at the frequency $f_1$ of the oscillator 130 locks the latter on a harmonic of order N of $f_1$ such that $Nf_1 \approx f_G$ where $f_G$ is the frequency in free oscillation regime (that is to say in non-switched regime) of the oscillator 130, corresponding to the control voltage $V_{ctrl}$. The order of the harmonic on which the oscillator locks is thus a function of the control voltage.

FIG. 2 represents a time chart of signals present at different points of the frequency synthesis device of FIG. 1.

The first line corresponds to the base signal $s_1$ (assumed in the figure of duty cycle ½), of frequency $f_1$, at the output of the base frequency generator 110.

The second line corresponds to the signal $s_G$ at the output of the switching power supply oscillator 130. It is in the form of pulsed sinusoidal oscillations, that is to say in the form of wave trains, the repetition frequency of these trains being equal to the frequency $f_1$ and the frequency of the sinusoidal oscillations being equal to $Nf_1$. The oscillations of the different pulses all start with a same initial phase.

The spectrum $S_1$ of the signal $s_1$ is a line spectrum having a general cardinal sine shape. More specifically, the spectrum $S_1$ may be expressed in the form:

$$S_1(f) = \left(\text{sinc}\left(\pi \frac{f}{f_w}\right) \cap \left(\frac{f}{f_1}\right)\right) \quad (1)$$

where sinc is the cardinal sine function, $f_w = 1/T_w$ where $T_w$ is the width of the time slot of a pulse repeating at the frequency $f_1$ in the signal $$s_1, \cap\left(\frac{f}{f_1}\right) = \sum_{k=-\infty}^{+\infty} \delta(f - kf_1)$$

(where $\delta$ is the Dirac function) is a Dirac comb of which the lines are spaced apart by $f_1$.

The spectrum $S_G$ of the signal $s_G$ is none other than the same spectrum of lines shifted by $f_G = Nf_1$:

$$S_G(f) = \left(\text{sinc}\left(\pi \frac{f - Nf_1}{f_w}\right) \cap \left(\frac{f}{f_1}\right)\right) \quad (2)$$

The signal $s_G$ is next the subject of a passband filtering of very high selectivity in a frequency recovery circuit, 140, to only select the line at the frequency $Nf_1$. This frequency recovery circuit is in the form of an injection locked oscillator or ILO as described for example in the article of M. Tiebout entitled "A 50 GHz direct injection locked oscillator topology as low power frequency divider in 0.13 μm CMOS" published in Proc. of the 29th European Solid State Circuits Conference, pp. 73-76, 16-18 Sep. 2003.

The signal, $s_{out}$, at the output of the frequency recovery circuit, is a continuous sinusoidal signal of frequency $Nf_1$ stable in frequency and in phase, as represented on the final line of FIG. 2.

The frequency synthesis device represented in FIG. 1 does not however make it possible to attain very high multiplication orders. Indeed, the locking of the oscillator ILO on a harmonic only intervenes if the power of this harmonic is greater than a minimum power. Yet, the power of a harmonic in the signal $s_G$ decreases according to a cardinal sine law from the central frequency. It is possible to envisage reducing the duty cycle of $s_1$ to widen the main lobe of the cardinal sine but, in this case, the wave trains are short and the locking of the oscillator ILO is not ensured.

A first solution for overcoming this limitation is to cascade several frequency synthesis stages of the type represented in FIG. 1, each stage serving to generate the base signal of the following stage.

FIG. 3 schematically represents a frequency synthesis device employing a cascading of two frequency synthesis stages of the type of FIG. 1.

This device 300 includes a base frequency generator, 310, identical to the generator 110, followed by a first frequency synthesis stage, 320, and a second frequency synthesis stage, 330. The first frequency synthesis stage is composed of a first switching power supply oscillator, 321, and a first frequency recovery circuit, 322. The second stage, 330, includes in a similar manner a second switching power supply oscillator, 331, and a second frequency recovery circuit, 332.

The output sinusoidal signal, $s_{out}^1$, of the first frequency synthesis stage is square shaped in the shaping circuit, 325. The periodic signal at the output of the shaping circuit, at the fundamental frequency $f_2 = Nf_1$, serves to switch the power supply of the second oscillator, 331. This second oscillator phase locks on a harmonic of frequency $Mf_2 = NMf_1 \approx f_G^2$ where $f_G^2$ is the natural frequency (that is to say in free oscillation regime) of the oscillator 331 at the control voltage $V_{ctrl}^2$.

FIG. 4 represents a time chart of signals present at different points of the frequency synthesis device of FIG. 3.

The first line corresponds to the signal $s_1$ at the output of the base frequency generator.

The second line corresponds to the signal $s_G^1$, at the output of the first switching power supply oscillator 321.

The third line corresponds to the signal $s_2$, at the output of the shaping circuit 325.

The fourth line corresponds to the signal $s_G^2$, at the output of the second switching power supply oscillator 331.

The final line corresponds to the signal $s_{out}$, at the output of the second frequency recovery circuit, 332.

The solution proposed in FIG. 3 is complex because it requires as many frequency recovery circuits as frequency synthesis stages, which leads to high energy consumption. Such a solution cannot notably be envisaged for mobile terminals with low autonomy.

The aim of the present invention is consequently to propose a frequency synthesis device making it possible to attain high multiplication orders while being relatively simple and of low energy consumption.

DESCRIPTION OF THE INVENTION

The present invention is defined by a frequency synthesis device including:
  a base frequency generator suited to generating a plurality K of first base signals, said first base signals being clock signals with non-overlapping phases, of same frequency $f_1$;
  a first synthesis stage including a plurality K of first switching power supply oscillators of identical structure and of same natural frequency, $f_G^1$, the power supplies of these K first oscillators being respectively switched by said K base signals, the output signals ($s_G^{1,i}$, i=1, ..., K) of these K first oscillators being combined to supply a second base signal ($s_2$), of square shape and periodic, of frequency $f_2=Nf_1$ where N is an integer;
  a second synthesis stage including a second switching power supply oscillator of which the supply is switched by the second base signal, the output signal of this second oscillator being in the form of wave trains, the repetition frequency of these wave trains being equal to $f_2$ and the frequency of these waves being equal to $Mf_2$ where M is an integer, the second synthesis stage further including a frequency discriminator circuit adapted to filtering the output signal ($s_G^2$) of the second oscillator to supply a sinusoidal signal at the frequency $Mf_2$.

Advantageously, the output signals of the K first oscillators are summed after having been respectively square shaped in K shaping circuits.

Typically, the K first switching power supply oscillators are VCO type oscillators and are controlled by a same control voltage ($V_{ctrl}^1$).

The frequency discriminator circuit is preferably an injection locked oscillator of which the resonance band includes the frequency $Mf_2$.

The duty cycles of the first base signals are advantageously all equal to 1/K.

For example K=2, the two first base signals then being opposite to each other.

The base frequency generator may notably include a voltage controlled oscillator, frequency locked and in phase by means of a loop PLL on a reference frequency supplied by a quartz resonator.

BRIEF DESCRIPTION OF THE DRAWINGS

Other characteristics and advantages of the invention will become clear on reading a preferential embodiment of the invention, described with reference to the appended figures among which.

DETAILED DESCRIPTION OF PARTICULAR EMBODIMENTS

Figure 1:
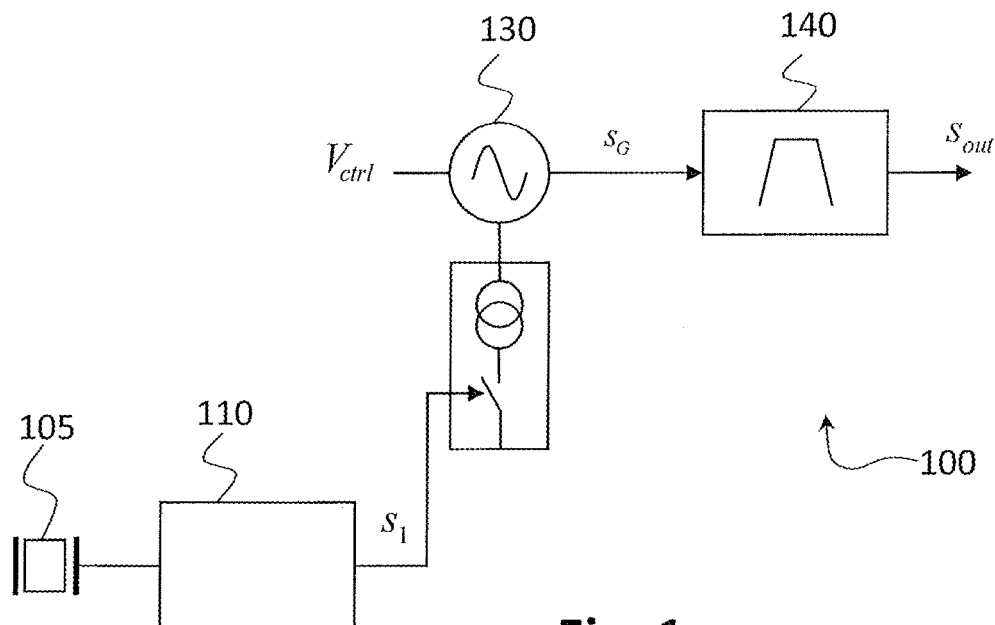
FIG. 1 schematically represents a frequency synthesis device known from the prior art.
Figure 2:
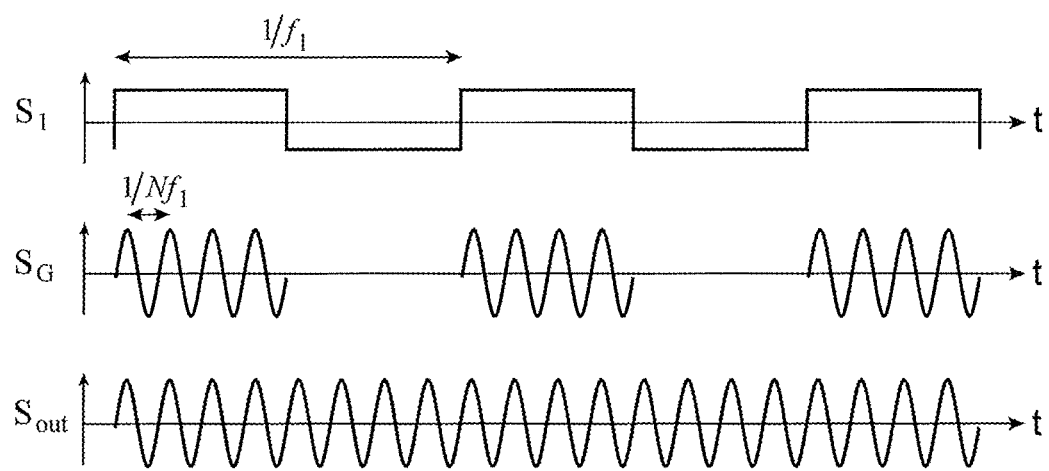
FIG. 2 represents a time chart of signals present at different points of the synthesis device of FIG. 1.
Figure 3:
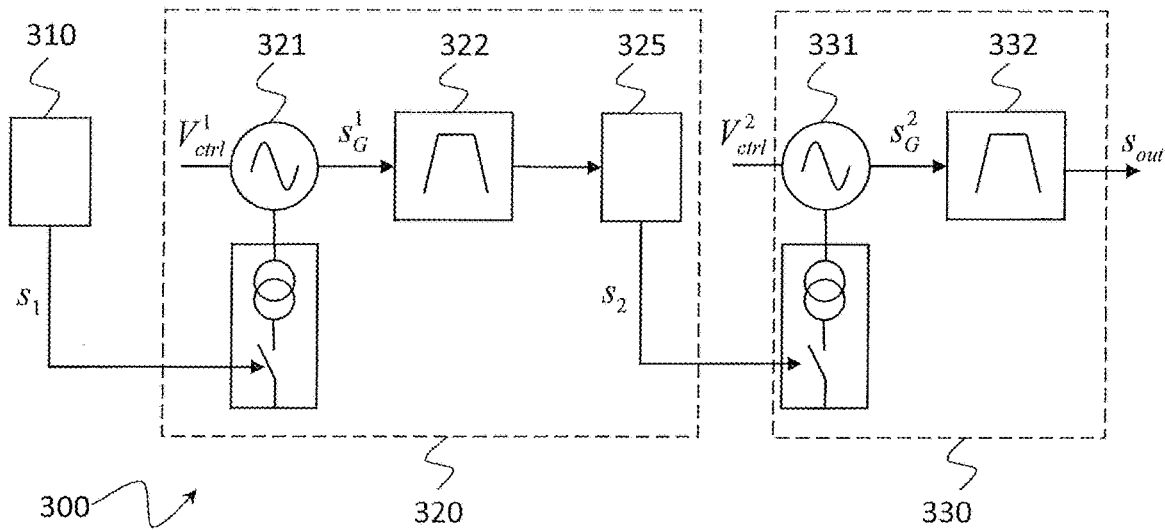
FIG. 3 represents a frequency synthesis device with high multiplication order employing the cascading of several frequency synthesis stages.
Figure 4:
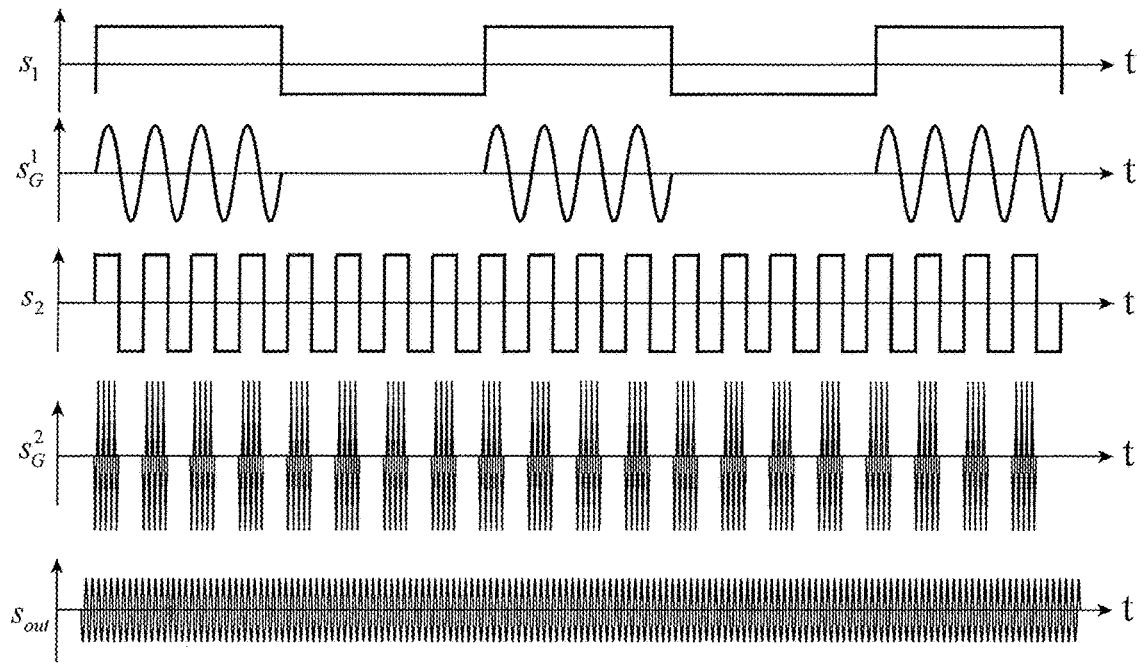
FIG. 4 represents a time chart of signals present at different points of the frequency synthesis device of FIG. 3.

A frequency synthesis device with several synthesis stages according to the principle of FIG. 3 is again considered. A first basic idea of the invention is to do without the frequency recovery circuit to obtain a device with simplified structure.

Figure 5:
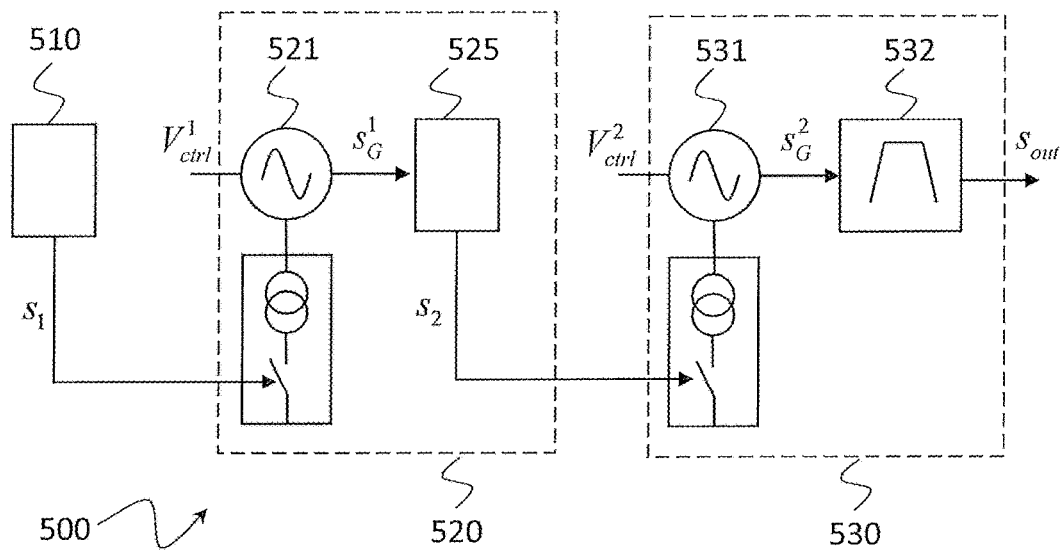
FIG. 5 schematically represents a frequency synthesis device with high multiplication order and with simplified structure.

FIG. 5 schematically represents such a frequency synthesis device with high multiplication order and with simplified structure.

This device, 500, includes a base frequency generator, 510, identical to the generator 310, a first stage, 520, comprising a first switching power supply oscillator, 521, a shaping circuit (square or pseudo-square), 525, and a second stage, 530, including a second switching power supply oscillator, 531, and a frequency recovery circuit, 532.

Figure 6:
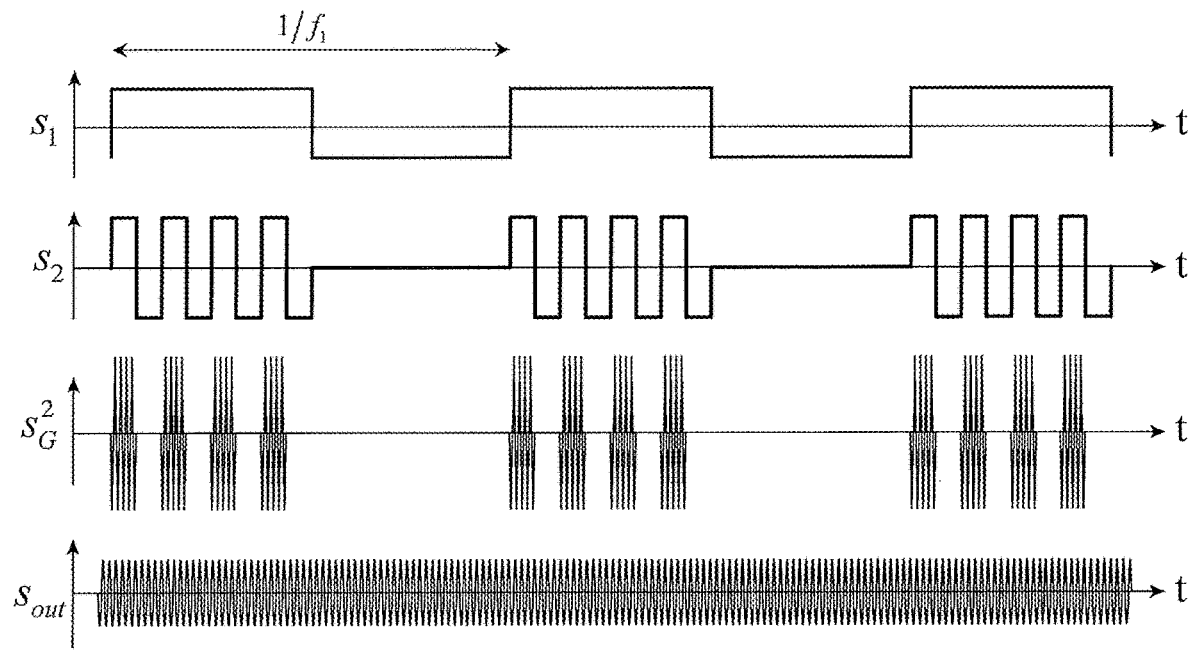
FIG. 6 represents a time chart of signals present at different points of the frequency synthesis device with simplified structure of FIG. 5.

FIG. 6 represents a time chart of signals present at different points of the frequency synthesis device with simplified structure of FIG. 5.

The first line of the time chart corresponds to the signal $s_1$ at the output of the base frequency generator, serving for the switching of the power supply of the first oscillator 521.

The second line corresponds to the signal $s_2$ at the output of the shaping circuit 525, serving for the switching of the power supply of the second oscillator 531.

The third line corresponds to the signal $s_G^2$ at the output of the second switching power supply oscillator, 531.

The final line corresponds to the signal $s_{out}$ at the output of the frequency recovery circuit 532.

It is noted here that the signal $s_G^2$ is zero when the signal $s_1$ is zero, this zero crossing occurring at the rhythm of the base frequency $f_1$. In other words, the spectrum $S_G^2$ of $s_G^2$ comprises a large number of lines spaced apart by $f_1$, as may furthermore be observed in FIG. 7.

Figure 7:
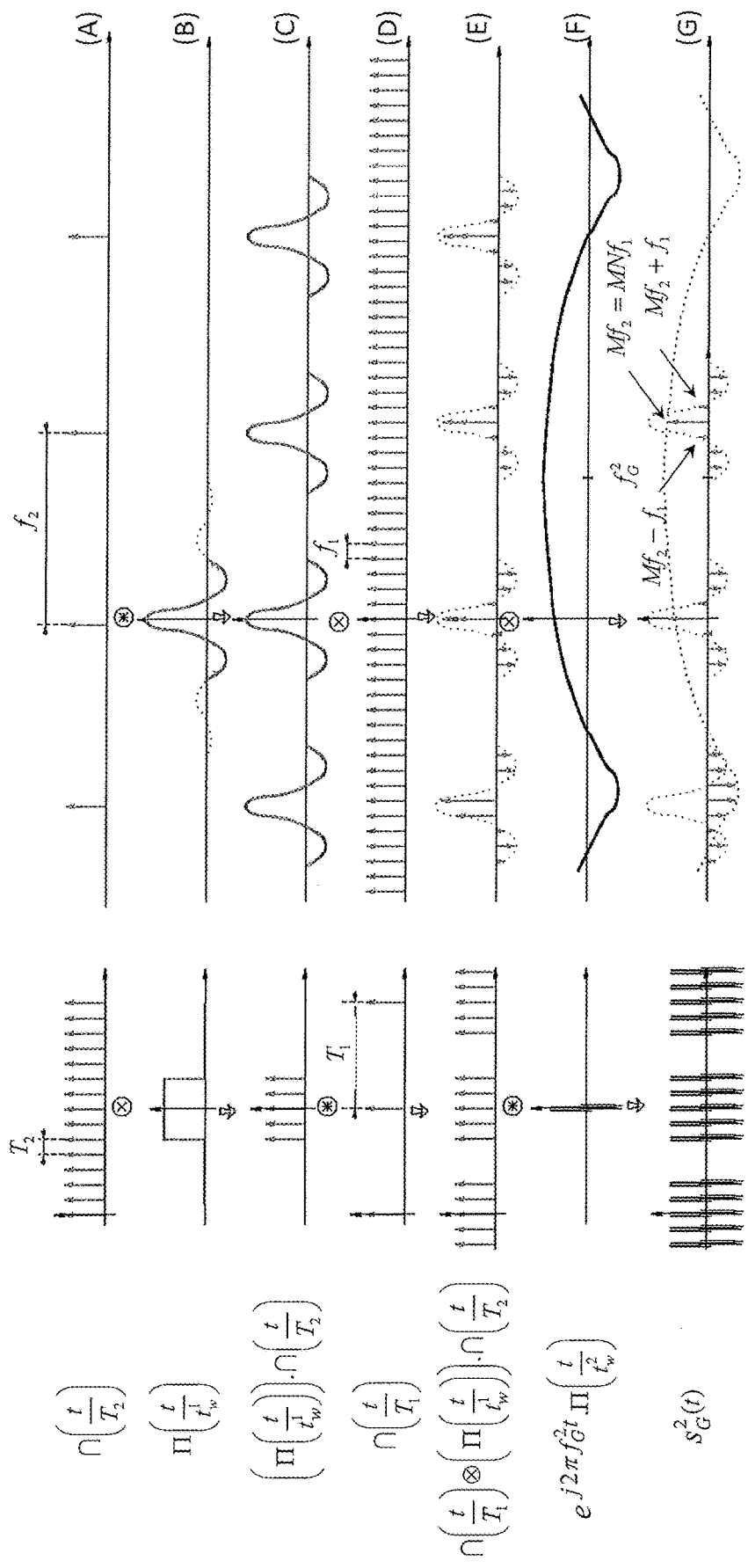
FIG. 7 represents the spectrum of the signal at the output of the second switching power supply oscillator of FIG. 5.

In FIG. 7 are represented the different steps (A)-(G) making it possible to calculate the spectrum $S_G^2$, with, on the left, the representation of these steps in the temporal domain and, on the right, the corresponding representation in the frequency domain.

The signal $s_G^2$ may be expressed in the form:

$$S_G^2(t) = \left( e^{j2\pi f_G^2 t} \cdot \prod\left(\frac{t}{t_w^2}\right) \right) \otimes \left( \prod\left(\frac{t}{T_1}\right) \otimes \left( \prod\left(\frac{t}{t_w^1}\right) \cdot \prod\left(\frac{t}{T_2}\right) \right) \right) \quad (3)$$

where $$\prod\left(\frac{t}{T}\right)$$

represents the port function of width T, $$\prod\left(\frac{t}{T}\right) = \sum_{k=-\infty}^{+\infty} \delta(t-kT)$$

is a Dirac comb of period T, $t_w^1$ is the width of the pulse in the base signal $$\left(t_w^1 = \frac{T_1}{2}\right)$$

for a signal of duty cycle ½), $T_1=1/f_1$, $T_2=1/f_2$, and $f_G^2 \approx Mf_2 = NMf_1$.

The steps (A)-(G) of constructing the signal $s_G^2$ are represented in the left part of the figure, these steps corresponding to the operations appearing from right to left in the expression (3).

The spectrum $S_G^2$ is then expressed as follows:

$$S_G^2(f) = \left( \text{sinc}\left(\frac{f - f_G^2}{2f_2}\right) \right) \left( \prod\left(\frac{f}{f_1}\right) \cdot \left( \text{sinc}\left(\frac{f}{f_w^1}\right) \right) \otimes \prod\left(\frac{f}{f_2}\right) \right) \quad (4)$$

with $f_w^1 = 1/t_w^1$ ($2f_1$ if the duty cycle is ½).

At line (G) may be noted the presence of a large number of spectral lines spaced apart by $f_1$, coming from the repetition of the pattern PT indicated in FIG. 5. The selection of the line at the frequency $NMf_1$ is very delicate and requires an injection locked oscillator with very high quality factor (ratio of the natural frequency of the oscillator over the resonance band width). Moreover, the fact of having available a very narrow resonance band considerably reduces the locking range of the oscillator ILO.

A second basic idea of the invention is to eliminate the comb of lines spaced apart by $f_1$ in the spectrum $S_G^2$ using a plurality of base signals at the frequency $f_1$ and with non-overlapping phases as described hereafter.

Figure 8:
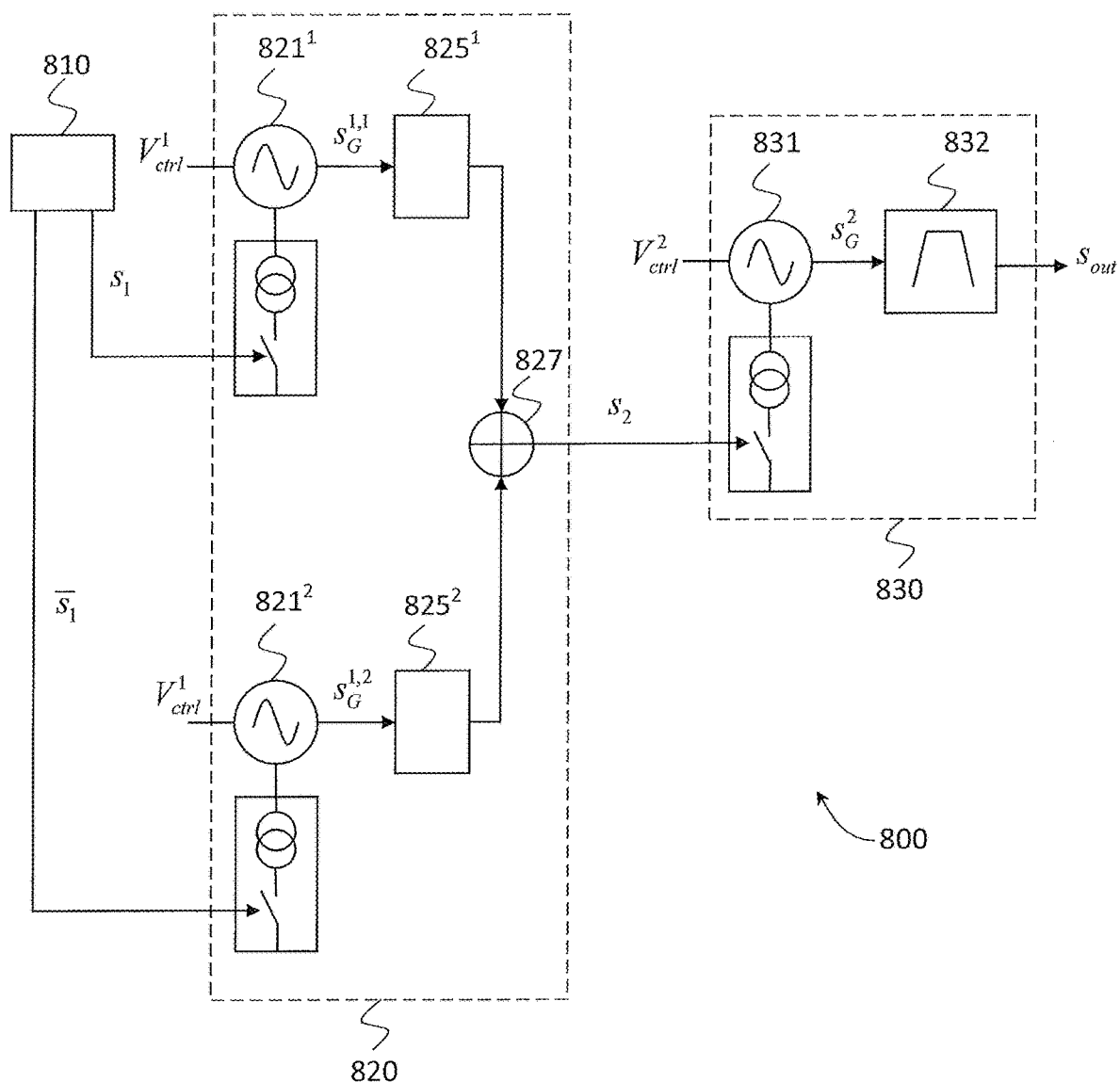
FIG. 8 schematically represents a frequency synthesis device with high multiplication order, according to a first embodiment of the invention.

FIG. 8 schematically represents a frequency synthesis device with high multiplication order, according to a first embodiment of the invention.

The frequency synthesis device, 800, includes a base frequency generator, 810, generating two square clock signals at the frequency $f_1$ and opposite to each other, $s_1$ and $\overline{s_1}$.

These two base signals come for example from complementary outputs Q and $\overline{Q}$ of a flip-flop D of which the input CK receives a clock signal at the frequency $2f_1$ supplied by a quartz resonator, 805. Alternatively, the signal $\overline{s_1}$ could be obtained from $s_1$ by means of an inverter, 807, as represented, the signal $s_1$ furthermore passing through a delay element, 806, in such a way that the signals at the output of 806 and 807 are temporally aligned. Obviously, it would be possible in the same way to use an oscillator VCO servo-controlled by means of a loop PLL on a sub-multiple frequency of $f_1$ supplied by the quartz resonator to generate the base signals $s_1$ and $\overline{s_1}$.

The base signals $s_1$ and $\overline{s_1}$ respectively switch the power supply of two first switching power supply oscillators, $821^1$ and $821^2$. These two first oscillators are VCOs of identical structure controlled by the same control voltage, $V_{ctrl}^1$ and thus have the same natural oscillation frequency (that is to say in non-switched regime), $f_G^1$. The oscillators $821^1$ and $821^2$ consequently phase locks on the same harmonic at the frequency $Nf_1$.

The signals at the output of the oscillators $821^1$ and $821^2$, noted respectively $s_G^{1,1}$ and $s_G^{1,2}$, are pulsed sinusoidal oscillations, a pulse of $s_G^{1,1}$ corresponding to a zero voltage interval in $s_G^{1,2}$ and vice versa.

The signals $s_G^{1,1}$ and $s_G^{1,2}$ are respectively square shaped in the shaping circuits $825^1$ and $825^2$. After shaping, these signals are summed by means of a port OR, 827, to supply a second base signal, $s_2$. Unlike the signals $s_G^{1,1}$ and $s_G^{1,2}$, the signal $s_2 = s_G^{1,1} + s_G^{1,2}$ is not pulsed and its fundamental frequency is equal to $Nf_1$.

This second base signal switches the power supply of a second switching power supply oscillator, 831. This oscillator is of VCO type and is controlled by a control voltage $V_{crtl}^2$. The natural oscillation frequency of the oscillator corresponding to this control voltage is noted $f_G^2$. The oscillator phase locks on a harmonic of $f_2 = Nf_1$ at the frequency $Mf_2 = MNf_1$, the control voltage $V_{ctrl}^2$ makes it possible to select the order M of the harmonic. The signal $s_G^2$ at the output of the oscillator 831 is in the form of wave trains repeating at the repetition frequency $f_2$, the frequency of the oscillations within a wave train being equal to $Mf_2$.

The signal $s_G^2$ is supplied to a frequency recovery (or discriminator) circuit, 832, realized in the form of an ILO oscillator as indicated previously. When the frequency $Mf_2$ of the injected signal falls within the resonance frequency band of the ILO oscillator, the oscillator phase locks on the injection signal to supply a sinusoidal signal (non-pulsed) at the frequency $Mf_2$, stable in frequency and in phase.

The frequency recovery circuit 832 does not need a quality factor as high as the frequency recovery circuit 532. Indeed, the spectrum $S_G^2$ of $s_G^2$ not having rays spaced apart by $f_1$ but only $f_2 = Nf_1$, the constraint on the resonance band width may be relaxed by a factor N.

In practice, the characteristic parameters of the ILO oscillator will be chosen in such a way that the natural frequency of the ILO oscillator is close to the target frequency and $V_{ctrl}^1$ and/or $V_{ctrl}^2$ will be varied in such a way that a ray is situated as close as possible to $Mf_2$ to obtain the maximum output power.

Those skilled in the art will understand that the frequency synthesis device of FIG. 8 includes two synthesis stages, 820 and 830, only the second is equipped with a frequency discriminator circuit, which makes it possible to reduce the energy consumption of the device.

Figure 9:
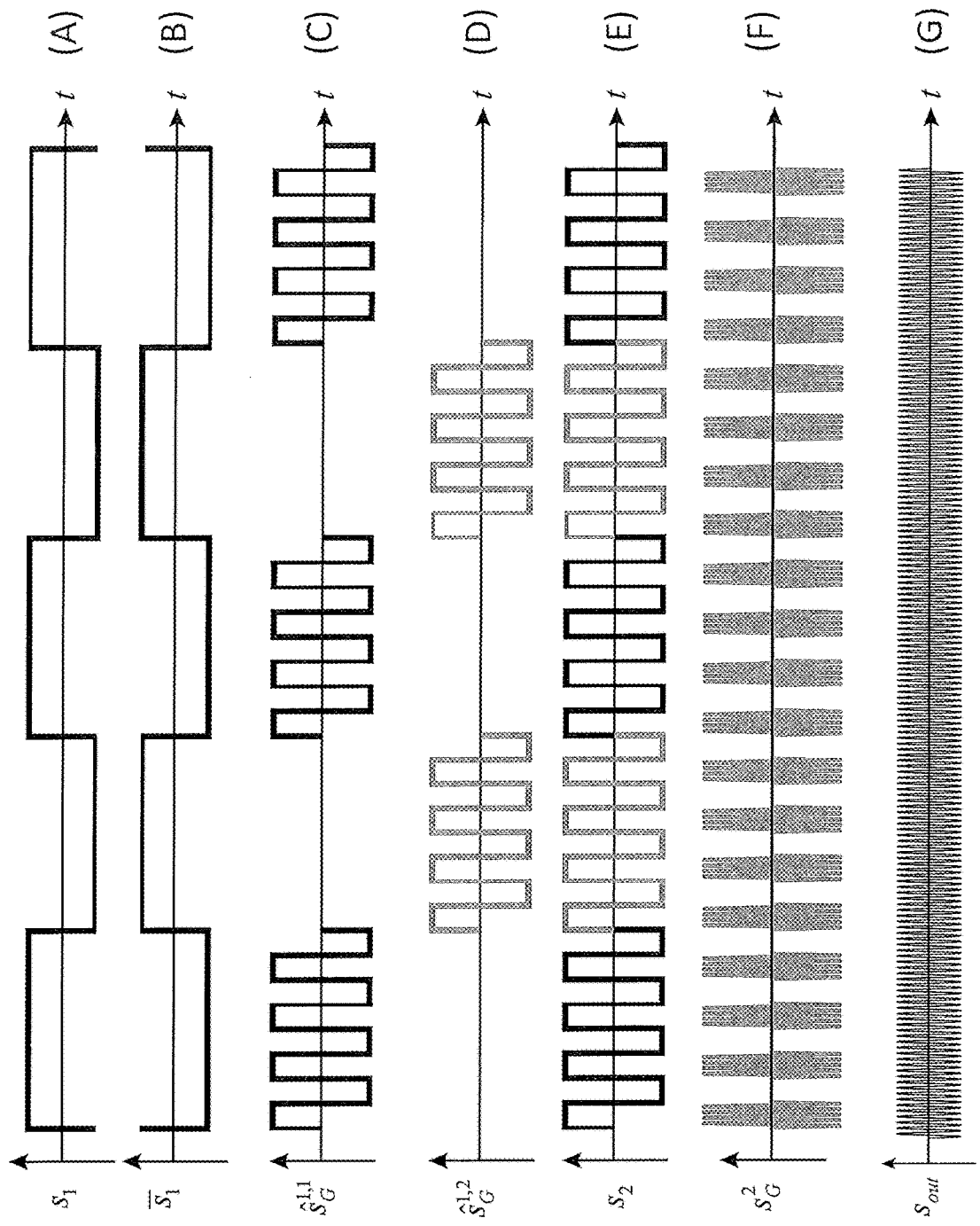
FIG. 9 represents a time chart of signals present at different points of the frequency synthesis device of FIG. 8.

FIG. 9 represents a time chart of signals present at different points of the frequency synthesis device of FIG. 8.

The two first lines (A) and (B) of the time chart represent the base signals $s_1$ and $\overline{s_1}$. It is here assumed that the duty cycles of these signals were equal to ½. In the general case, they may be equal to η and 1−η even if the value η=½ is preferred.

The following two lines (C) and (D) of the time chart represent the signals $s_G^{1,1}$ and $s_G^{1,2}$ supplied by the two first switching power supply oscillators, after they have been shaped in the circuits $825^1$ and $825^2$. The line (E) represents for its part the second base signal $s_2$.

The line (F) of the time chart represents the signal $s_G^2$ at the output of the third switching power supply oscillator.

Finally, the final line (G) represents the output signal, $s_{out}$, supplied by the frequency recovery circuit.

Figure 10:
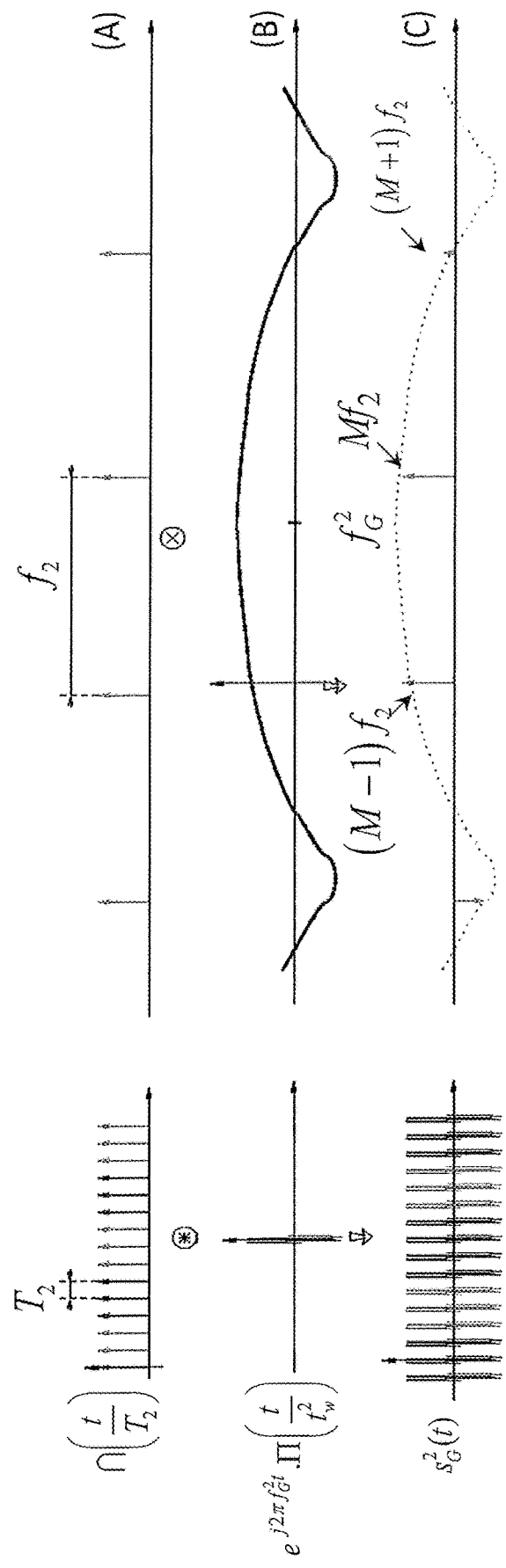
FIG. 10 represents the spectrum of the signal at the output of the second switching power supply oscillator of FIG. 8.

FIG. 10 represents the spectrum of the signal at the output of the second switching power supply oscillator of FIG. 8.

The left part of the figure gives a temporal representation of the signals and the right part the corresponding frequency representation.

On account of the complementary of the signals $s_1$ and $\overline{s_1}$, the switching signal $s_2$ is not pulsed and the signal $s_G^2(t)$ is expressed simply in the form:

$$s_G^2(t) = e^{j2\pi f_G^2 t} \cdot \prod\left(\frac{t}{t_w^2}\right) \otimes \bigcap\left(\frac{t}{T_2}\right) \quad (5)$$

The spectrum of this signal is thus given by:

$$S_G^2(f) = \left(\mathrm{sinc}\left(\frac{f - f_G^2}{2f_2}\right)\right) \cdot \bigcap\left(\frac{f}{f_2}\right) \quad (6)$$

It may be noted that the rays at intervals of $f_1$ have been eliminated and that it is consequently much easier to produce the frequency discriminator circuit 832 to select the target frequency.

Figure 11:
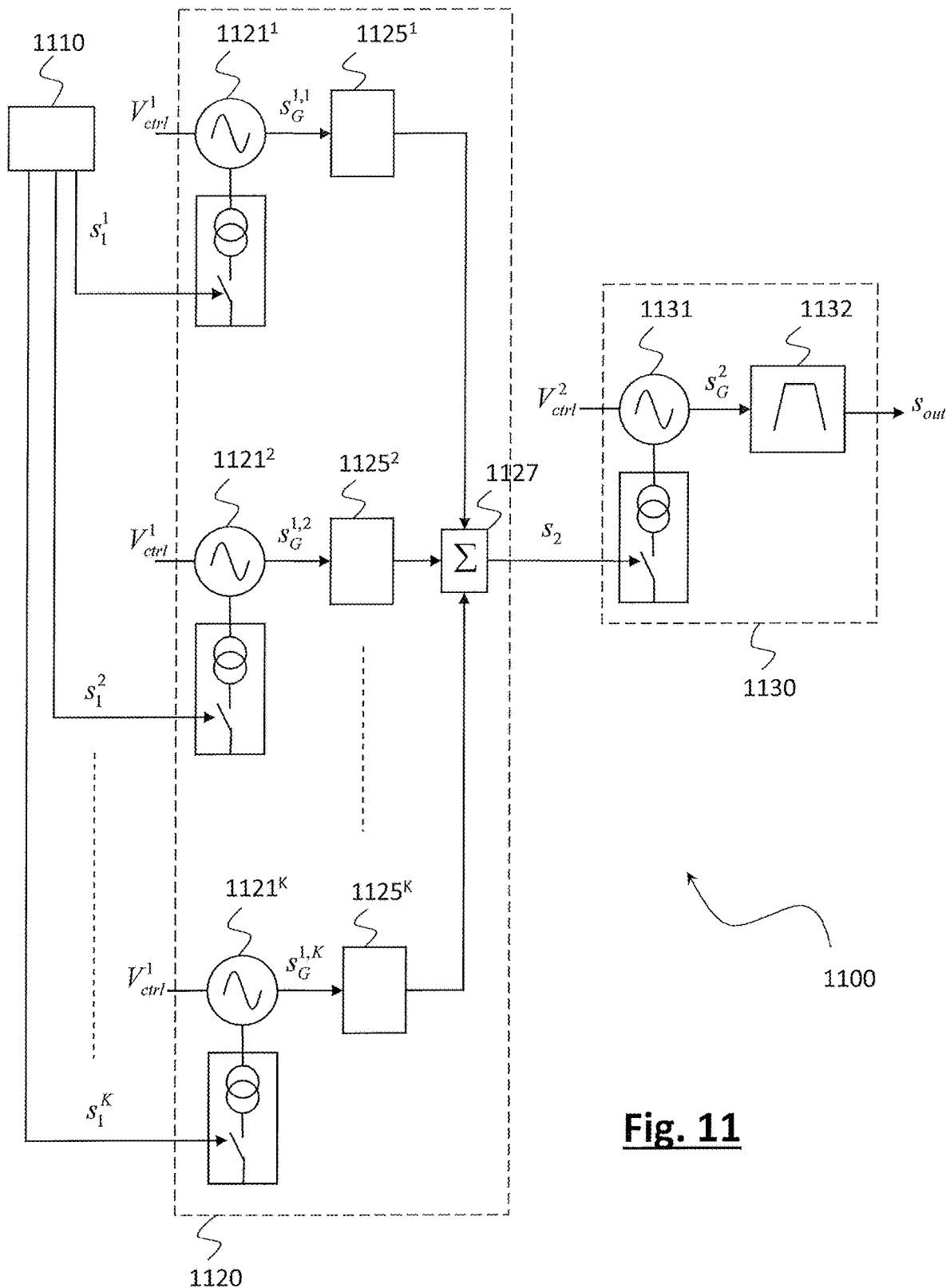
FIG. 11 schematically represents a frequency synthesis device with high multiplication order, according to a second embodiment of the invention.

FIG. 11 schematically represents a frequency synthesis device with high multiplication order, according to a second embodiment of the invention.

This second embodiment may be considered as a generalisation of the first in so far as it uses as base signals frequency time clocks $f_1$ with non-overlapping phases, noted $s_1^i$, i=1, . . . , K.

Signals with non-overlapping phases designate square signals of same frequency, $s^i$, i=1, . . . , K, being able conventionally to take the logic values 0 or 1, such that:

$$s^i * s^j = 0, \forall i \neq j \text{ and } \sum_{i=1}^{K} s^i = 1 \quad (7)$$

where * signifies the logic multiplication (AND) and the sum is a logic sum (OR).

In this embodiment, the base frequency generator, 1110, generates a plurality K of first base signals $s_1^i$, i=1, . . . , K of frequency $f_1$ and with non-overlapping phases. The duty cycles $\eta_i$ of these first base signals may be distinct but bear out the relationship $$\sum_{i=1}^{K} \eta_i = 1.$$

Preferably however, the duty cycles $\eta_i$ will all be chosen equal to 1/K. The whole number K will advantageously be chosen equal to a power of 2 for reasons of ease of implementation.

The first base signals $s_1^i$, i=1, . . . , K switch respectively the power supply of K switching power supply oscillators, $1121^1$, . . . , $1121^K$.

These K oscillators are VCOs of identical structure controlled by a same control voltage, $V_{ctrl}^1$, and thus have the same natural oscillation frequency $f_G^1$. They phase lock on the same harmonic at the frequency $Nf_1$.

Each of the signals at the output of the oscillators $1121^1$, . . . , $1121^K$ noted $s_G^{1,i}$, i=1, . . . , K, has pulsed sinusoidal oscillations, each pulse of $s_G^{1,i}$ corresponding to a zero voltage interval in the signals $s_G^{1,j}$, j≠i.

The signals $s_G^{1,i}$, i=1, . . . , K are respectively square shaped in the shaping circuits $1125^1$, . . . , $1125^K$. After shaping, these signals are summed by means of a port OR, 827, to supply a second base signal, $s_2$. Unlike the signals $s_G^{1,j}$, i=1, . . . , K, the signal $$s_2 = \sum_{i=1}^{K} s_G^{1,i}$$

is not pulsed and its fundamental frequency is equal to $Nf_1$.

The second base signal $s_2$ switches the power supply of the $(K+1)^{th}$ switching power supply oscillator, 1131, this oscillator phase locks on a harmonic of $f_2=Nf_1$ at the frequency $Mf_2=MNf_1$ as in the first embodiment. The signal $s_G^2$ at the output of the oscillator is supplied to the frequency recovery circuit, 1132, realized in the form of an ILO oscillator, to supply a non-pulsed sinusoidal signal, $s_{out}$, at the frequency $Mf_2$, stable in frequency and in phase.

The frequency synthesis device of FIG. 11 includes two synthesis stages, 1120 and 1130, only the second is equipped with a frequency discriminator circuit to supply the target frequency.

The invention claimed is:
1. A frequency synthesis device comprising:
a base frequency generator suited to generating a plurality K of first base signals, said first base signals being clock signals with non-overlapping phases, of same frequency $f_1$;
a first synthesis stage including a plurality K of first switching power supply oscillators of identical structure and of same natural frequency, $f_G^1$, power supplies of these K first oscillators being respectively switched by said K base signals, output signals of these K first oscillators being combined to supply a second base signal, of square shape and periodic, of frequency $f_2=Nf_1$ where N is an integer;
a second synthesis stage including a second switching power supply oscillator including a supply switched by the second base signal, an output signal of this second oscillator being in the form of wave trains, a repetition frequency of these wave trains being equal to $f_2$ and a frequency of these waves being equal to $Mf_g$ where M is an integer, the second synthesis stage further including a frequency discriminator circuit adapted to filtering the output signal of the second oscillator to supply a sinusoidal signal at the frequency $Mf_g$.

2. The frequency synthesis device according to claim 1, wherein the output signals of the K first oscillators are summed after having been respectively square shaped in K shaping circuits.

3. The frequency synthesis device according to claim 1, wherein the K first switching power supply oscillators are VCO type oscillators and that they are controlled by a same control voltage.

4. The frequency synthesis device according to claim 1, wherein the frequency discriminator circuit is an injection locked oscillator of which a resonance band includes the frequency $Mf_2$.

5. The frequency synthesis device according to claim 1, wherein duty cycles of the first base signals are all equal to $1/K$.

6. The frequency synthesis device according to claim 1, wherein K=2, two first base signals being opposite to each other.

7. The frequency synthesis device according to claim 1, wherein the base frequency generator comprises a voltage controlled oscillator, frequency locked and in phase with a PLL loop on a reference frequency supplied by a quartz resonator.

\* \* \* \* \*